United States Patent
Obeidat

(10) Patent No.: US 7,668,272 B1
(45) Date of Patent: Feb. 23, 2010

(54) METHOD AND APPARATUS FOR DATA TRANSFER BETWEEN MESOCHRONOUS CLOCK DOMAINS

(75) Inventor: Amjad T. Obeidat, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 606 days.

(21) Appl. No.: 10/973,761

(22) Filed: Oct. 26, 2004

(51) Int. Cl.
*H04L 7/00* (2006.01)
*H03K 3/00* (2006.01)

(52) U.S. Cl. ..................... 375/354; 327/296
(58) Field of Classification Search ................. 375/354, 375/355; 327/296, 297; 714/731, 744
See application file for complete search history.

(56) References Cited

U.S. PATENT DOCUMENTS

| | | | |
|---|---|---|---|
| 6,526,535 B1 * | 2/2003 | Warren | 714/727 |
| 6,907,541 B1 * | 6/2005 | Padmanabhan et al. | 713/503 |
| 7,038,514 B2 * | 5/2006 | Leith et al. | 327/198 |
| 7,265,524 B2 * | 9/2007 | Jordan et al. | 323/225 |
| 2003/0131160 A1 * | 7/2003 | Hampel et al. | 710/22 |
| 2004/0056864 A1 * | 3/2004 | Valmiki et al. | 345/531 |
| 2006/0089827 A1 * | 4/2006 | Gabele et al. | 703/17 |
| 2006/0187102 A1 * | 8/2006 | Bretchneider | 341/155 |

OTHER PUBLICATIONS

David G. Messerschmitt, "Synchronization in Digital System Design", IEEE Journal on Selected Areas in Communications, vol. 8, No. 8, Oct. 1990, pp. 1404-1419.

* cited by examiner

*Primary Examiner*—David C Payne
*Assistant Examiner*—Brian J Stevens

(57) ABSTRACT

Error-free data transfer between mesochronous clock domains can be accomplished by writing data to and reading data from a plurality of data storage elements in coordinated fashion. Write operations are controlled by execution of a state sequence synchronously with the source clock domain, and read operations are controlled by execution of the same state sequence synchronously with the destination clock domain. The states respectively correspond to the data storage elements, and the read and write executions of the state sequence do not simultaneously assume the same state.

20 Claims, 5 Drawing Sheets

US 7,668,272 B1

METHOD AND APPARATUS FOR DATA TRANSFER BETWEEN MESOCHRONOUS CLOCK DOMAINS

TECHNICAL FIELD OF THE INVENTION

The present invention is generally directed to digital data transfer and, more particularly, to synchronizing digital data transfers across a clock domain boundary.

BACKGROUND OF THE INVENTION

Data is commonly transferred between mesochronous domains where the phase relationship between the synchronizing clocks of the two domains is arbitrary. This situation is illustrated in FIG. 1. The sending and receiving blocks (e.g., logic/data processing blocks) are said to be mesochronous if their synchronizing clocks have the same frequency but have an arbitrary phase relationship. This is typically the case if both clocks are generated from the same source such as an on-chip phase-locked loop (PLL).

The elements that actually transfer data are typically flip-flops, also known as registers. When data is transferred between two registers operating with the same synchronizing clock, it is fairly simple to comply with the set-up-and-hold time requirement for latching in data. This is due to the fact that data and clock propagation delays are typically known apriori and it is possible to compensate for these delays. On the other hand, when data is transferred between two mesochronous blocks as in FIG. 1, it is not possible to assume that the set-up-and-hold time requirement is satisfied. If the receiving block latches in the data without proper timing, error-free operation cannot be guaranteed.

In order to guarantee error-free data propagation, the incoming data must be transferred or "shifted" from the sending clock phase to the receiving clock phase. This point is illustrated in FIG. 2, wherein the synchronizing clock for the sending block is referred to as Pclk, and the synchronizing clock of the receiving block is referred to as Txclk. FIG. 2 shows a stream of random data, DataIn, which is synchronous with Pclk and is provided at the sending block output. On the other hand, DataIn has an arbitrary phase relationship to Txclk. This arbitrary phase relationship can result in bit errors as the data crosses the clock domain boundary between the sending and receiving blocks.

It is therefore desirable to provide for error-free data transfer across a clock domain boundary between first and second mesochronous clock domains.

SUMMARY OF THE INVENTION

To address the above-discussed deficiencies of the prior art, it is a primary object of the present invention to provide for error-free data transfer across a clock domain boundary between first and second mesochronous clock domains.

According to exemplary embodiments of the invention, error-free data transfer between mesochronous clock domains can be accomplished by writing data to and reading data from a plurality of data storage elements in coordinated fashion. Write operations are controlled by execution of a state sequence synchronously with the source clock domain, and read operations are controlled by execution of the same state sequence synchronously with the destination clock domain. The states respectively correspond to the data storage elements, and the read and write executions of the state sequence do not simultaneously assume the same state.

The foregoing has broadly outlined the features and technical advantages of the present invention so that those skilled in the art may better understand the detailed description that follows. Additional features and advantages of the invention will be described below that form the subject of the claims of the invention. Those skilled in the art will appreciate that they may readily use the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it is advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, cooperate with, be proximate to, be bound to or with, have a property of, or the like. The term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

Exemplary embodiments of the invention provide a method and apparatus for synchronizing data transfers between two mesochronous clock domains. In some embodiments, a FIFO (First-In-First-Out) register structure is used to achieve synchronization. A FIFO is a collection of registers where data is stored and read in a rotational fashion. It is akin to a "Lazy Susan" which is used in restaurants to share food among diners seated at a circular table. The plates on the Lazy Susan correspond to the data bits that are being stored in the FIFO for a period of time. The data bits are written to and read from the FIFO periodically similar to the way plates are delivered to and then retrieved from a Lazy Susan.

Figure 1:
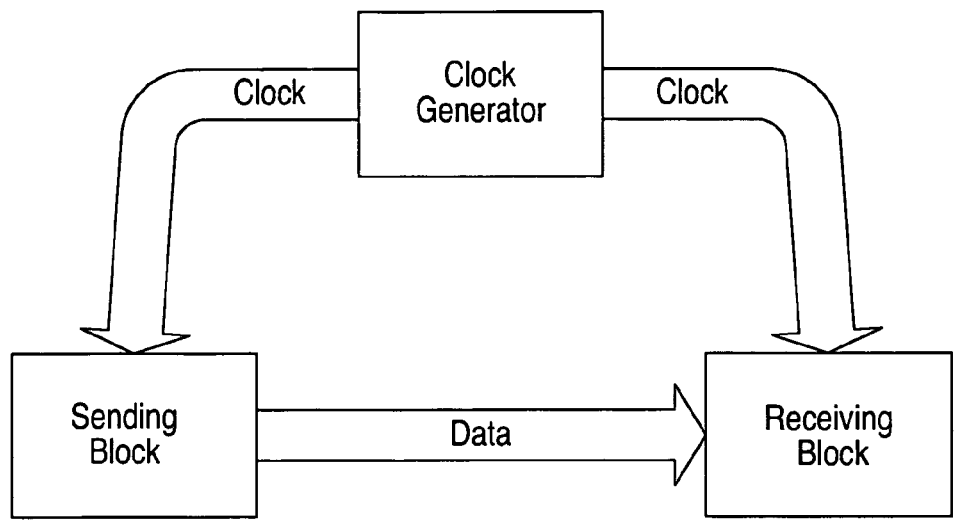
FIG. 1 diagrammatically illustrates a prior art digital system wherein data is transferred between two mesochronous clock domains.
Figure 3:
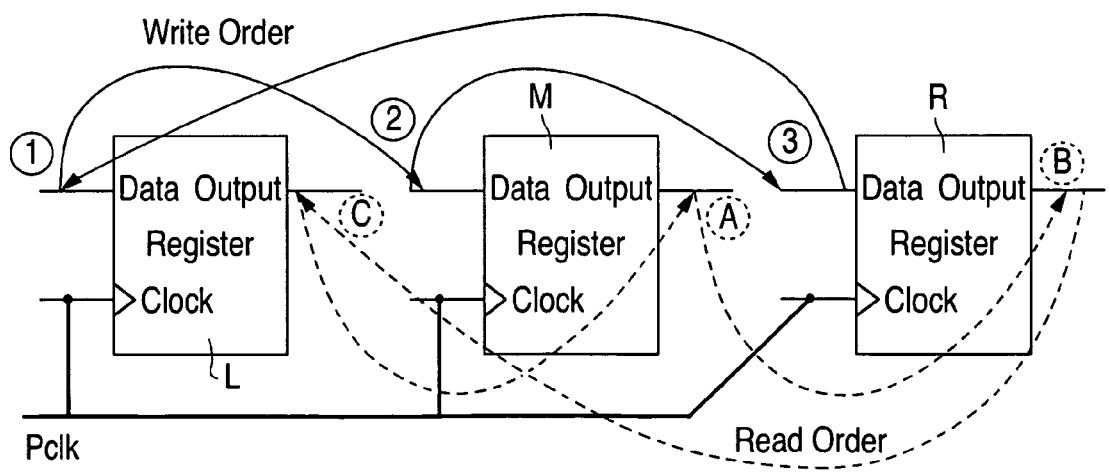
FIG. 3 diagrammatically illustrates a FIFO register structure and associated read/write selection scheme according to exemplary embodiments of the invention.
Figure 2A:
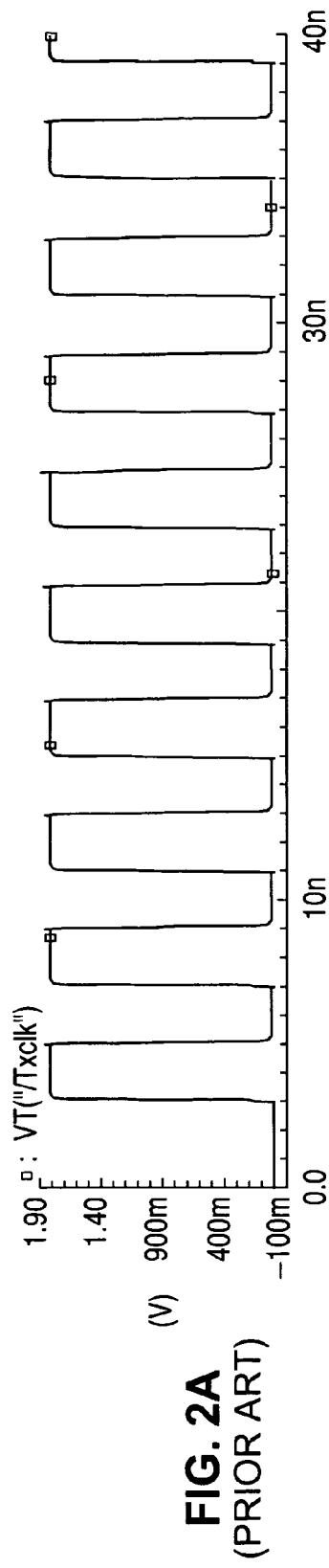
FIG. 2 is a timing diagram which illustrates relationships between the clock signals and the data of FIG. 1.
Figure 2B:
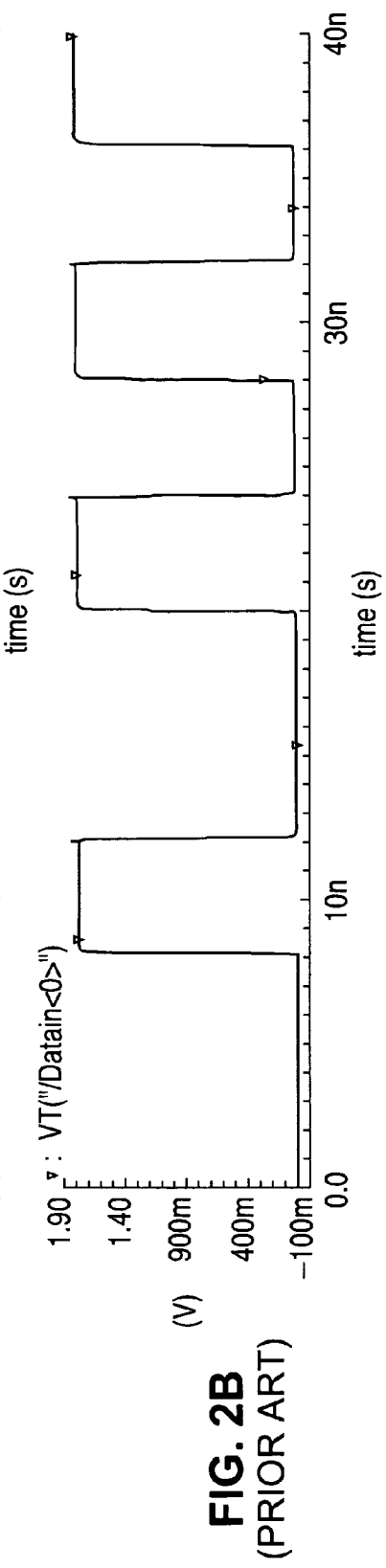
Figure 2C:
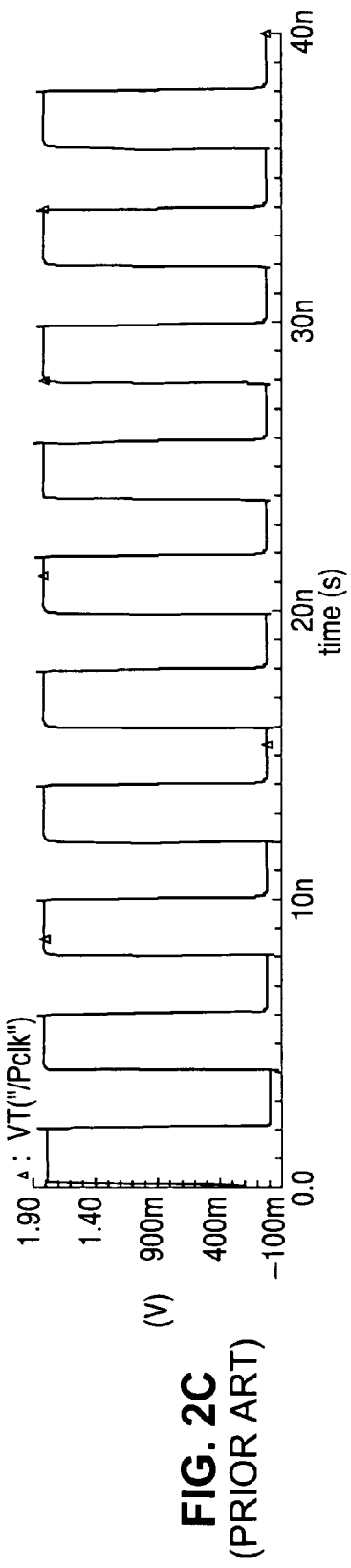

The FIFO includes a minimum of two registers. However, to increase robustness, some exemplary embodiments use three registers per bit as shown in FIG. 3. Data bits received sequentially from the sending block can be written to the FIFO structure as follows: first bit to the left register L, second bit to the middle register M, and third bit to the right register R. This writing process repeats itself for as long as the received bit sequence continues. At the same time, data is also read from the registers in analogous rotational fashion, but with a different starting point in order to avoid reading a register while its stored bit value is changing.

Read and write pointers control the reading and writing of the registers. The write pointer is synchronized with the sending clock domain, and the read pointer is synchronized with the receiving clock domain. According to exemplary embodiments, both pointers can be rotated in such a way as to guarantee that data is not read from a given register at the same time that data is being written to that register. Such a read/write collision could result in a bit error.

As indicated above, exemplary embodiments guarantee error-free operation by ensuring that the write pointer and the read pointer do not point to the same register at the same time. If that were not guaranteed, a collision would occur and the data would be read from a register that is in the process of changing its value. Initializing the pointers with different starting points guarantees that such collisions will not occur. Examples of the read order and the write order defined by the respective pointers are illustrated in FIG. 3. The solid lines with arrows indicate the movement of the write pointer, and the broken lines with arrows indicate the movement of the read pointer. In FIG. 3, the write pointer begins at the left register L (point 1). The next active edge of Pclk causes the write pointer to transition to the middle register M (point 2). The next active edge of Pclk transitions the write pointer to the right register R (point 3). The next active Pclk edge returns the write pointer to the left register L and the process then repeats. The read pointer goes through a similar sequence, but the read pointer is synchronized to Txclk and starts at the middle register M (point A). It then follows the sequence A-to-B-to-C-to-A outlined by the broken lines (corresponding to the register sequence M-to-R-to-L-to-M).

In some embodiments, the two pointers are hard-wired to start at the indicated positions in FIG. 3 (L for write pointer, M for read pointer) once they are enabled. A common enable signal provided by the sending block is used to enable both pointers. Before the enable signal is asserted, the FIFO registers are reset and the pointers are held in their "park" positions (L for write pointer, M for read pointer). The pointers remain parked until the enable signal is asserted. The park positions represent the starting points of the pointers. As indicated in FIG. 3, the write pointer is initially parked in the "Left" position while the read pointer is initially parked in the "Middle" position. Since the enable signal comes from the sending block, it is synchronous with the sending clock. This means that the actual starting moment for the read pointer is unknown due to its arbitrary phase relationship with the sending clock. This uncertainty is overcome by having the two pointers start from the differing "park" positions indicated.

Two data registers are normally sufficient to prevent read/write collisions from occurring. However, recognizing that there could be timing mismatches between the two registers due to their design or layout, some embodiments use three registers for added robustness.

Figure 4:
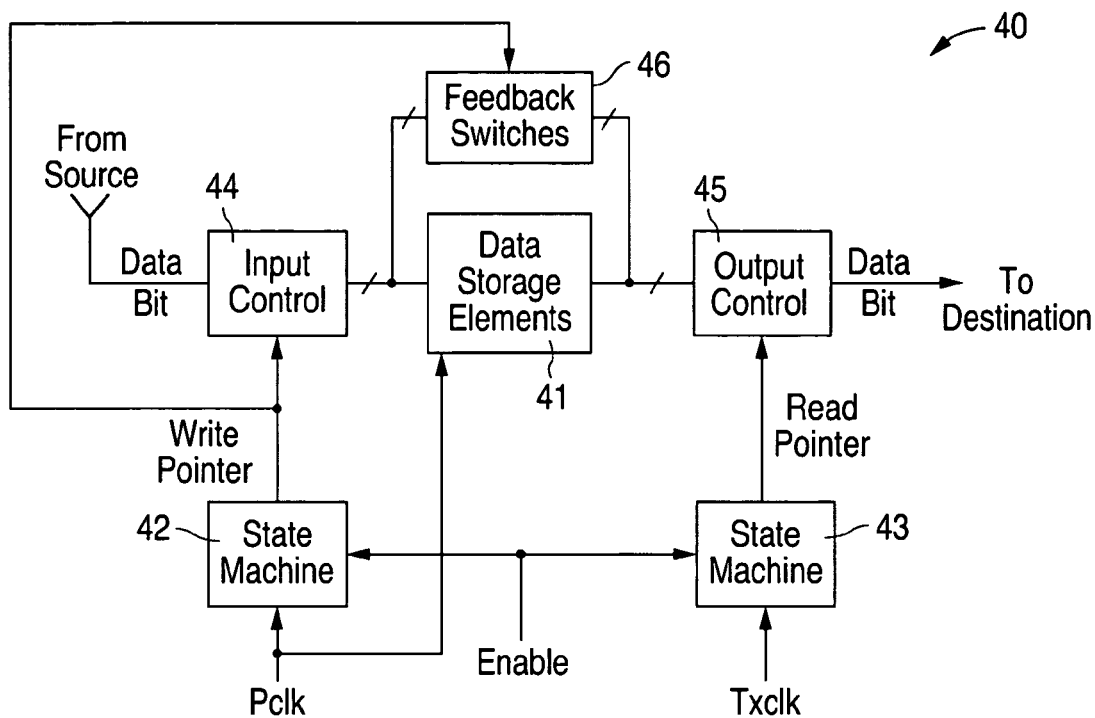
FIG. 4 diagrammatically illustrates exemplary embodiments of a clock domain linkage apparatus according to the invention.

FIG. 4 diagrammatically illustrates exemplary embodiments of a clock domain linkage apparatus 40 according to the invention. The apparatus 40 includes two or more data storage elements shown generally at 41. In some exemplary embodiments, the data storage elements 41 are implemented as the data registers of FIG. 3. State machines 42 and 43, an input controller 44 and an output controller 45 are cooperable for implementing a read/write scheme with respect to the data storage elements 41. In some exemplary embodiments, the state machines 42 and 43 implement a cyclic sequence of three states which respectively correspond to three data storage elements at 41 (for example the three data registers of FIG. 3). Thus, each of the state machines cycles through a repeating sequence of states as follows: left, middle, right, left, middle, right, etc. to implement the reading and writing scheme of FIG. 3. State machine 42 is synchronized by Pclk, and state machine 43 is synchronized by Txclk. State machine 42 provides the write pointer, and state machine 43 provides the read pointer. The "parked" state of the state machine 42 is the left state, and the "parked" state of the state machine 43 is the middle state. In some embodiments, each state machine includes a counter that is clocked by the associated synchronizing clock signal. The states correspond to the numerical count values of the counter.

In some embodiments, the input controller 44 is responsive to the state machine 42 assuming the left, middle and right states for respectively routing the currently received input data bit to the registers L, M and R of FIG. 3. In some exemplary embodiments, the input controller 44 is implemented as a de-multiplexer controlled by the write pointer.

The output controller 45 is responsive to the state machine 43 assuming the left, middle and right states for routing the outputs of the L, M and R registers, respectively, to the destination (receiving block). In some exemplary embodiments, the output controller 45 is implemented as a 3-to-1 multiplexer controlled by the read pointer.

The state machines 42 and 43 are commonly enabled by a single enable signal, and both state machines cyclically execute is the same identical sequence of states. However, because the state machine 43 is initialized to a state in the sequence (for example middle) that is one state ahead of the initialized state (for example left) of the state machine 42, and because the common enable signal is synchronous with Pclk, the state machines are guaranteed never to be in the same state simultaneously. This guarantee is described in more detail below with respect to FIGS. 6 and 7.

The clock domain linkage apparatus 40 of FIG. 4 also includes a plurality of feedback switches shown generally at 46. The feedback switches are respectively associated with the data storage elements at 41, and each feedback switch is responsive to the write pointer for selectively making and breaking a connection between the input and the output of the associated data storage element.

Figure 5:
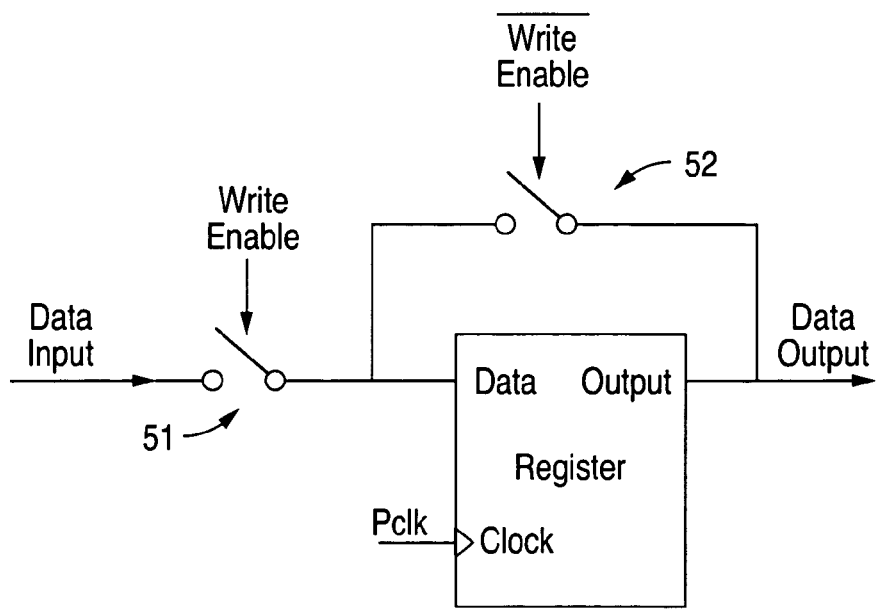
FIG. 5 illustrates a portion of FIG. 4 in more detail.

FIG. 5 illustrates an example of the feedback switches of FIG. 4. The feedback switches account for the fact that, in embodiments such as shown in FIG. 3, each data register receives Pclk pulses even when the write pointer is not addressing that register. The correct data value is maintained in the register by using feedback from the register output to its input. This assures that the stored data value is valid when the register is addressed using the read pointer. In FIG. 5, data is written to the register when the write pointer addresses that register. In particular, the write pointer constitutes (or causes assertion of) a "write enable" signal that closes an input switch 51 (e.g., in the input controller 44 of FIG. 4) and thereby allows data to be written to the register using Pclk. When the write pointer is not addressing the register, the "write enable" signal is de-asserted to open the input switch 51 and correspondingly close a feedback switch 52 to establish a feedback path to the register's data input. The feedback path maintains the data value in the register. The feedback switch 52 is open when input switch 51 is closed (i.e., when the register is selected by the write pointer).

Figure 6:
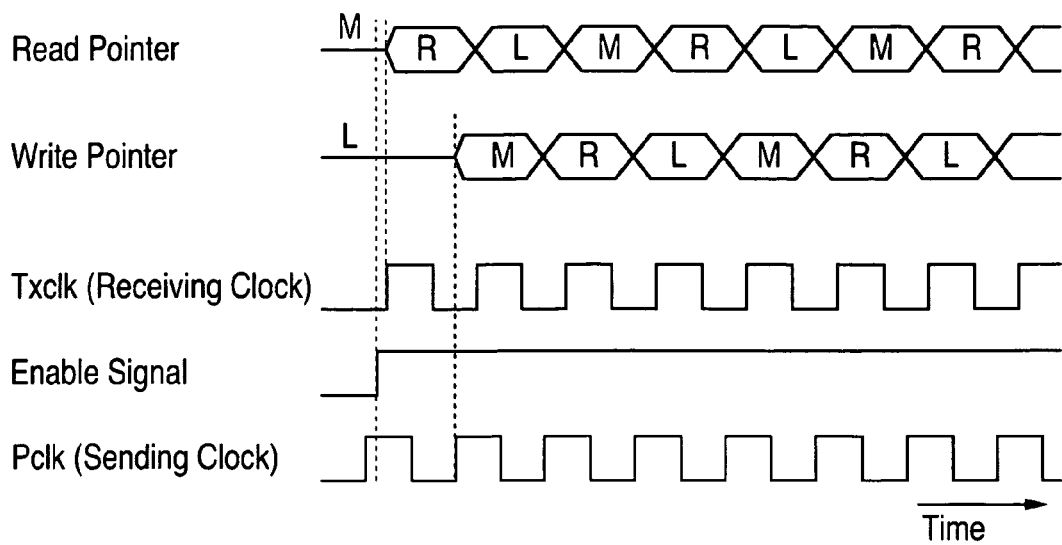
FIGS. 6 and 7 are timing diagrams which illustrate exemplary operations of the embodiments of FIGS. 3-5.
Figure 7:
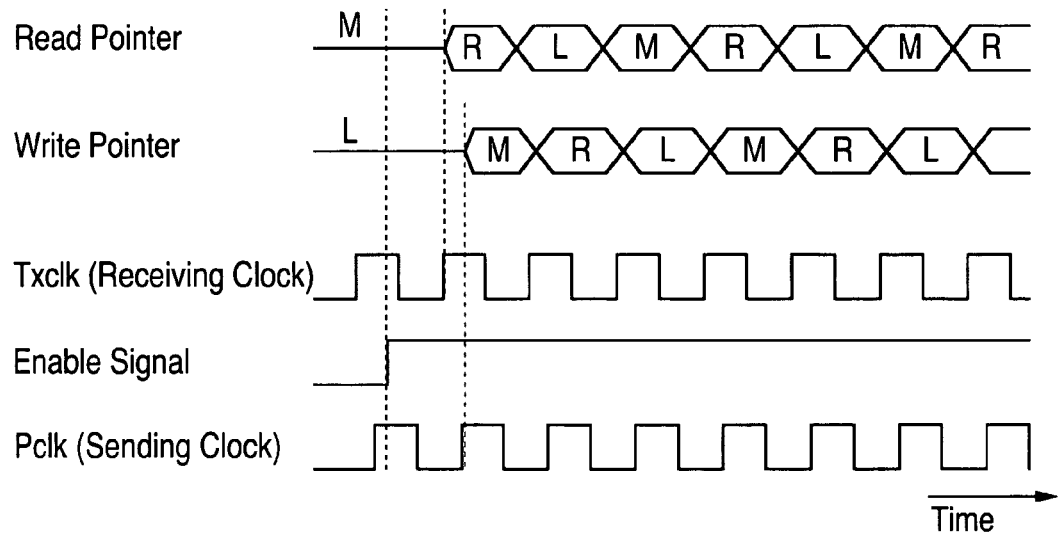

FIGS. 6 and 7 illustrate two extreme cases in terms of the timing relationship between Txclk and the enable signal of FIG. 4. In FIG. 6, the enable signal is asserted shortly before Txclk goes high. When this happens, the read pointer will move from its parked position (i.e., middle register M) to the right register R. The next active (in this example positive) edge of Pclk moves the write pointer to the middle register M, while the next active (in this example positive) edge of Txclk moves the read pointer to the left register L. In FIG. 6, the read pointer is guaranteed not to point to a register until at least one period of Pclk has elapsed since that register's output was changed.

In FIG. 7, the enable signal is asserted shortly after a positive edge of Txclk. In this case, the next positive edge of Txclk moves the read pointer to the right register R. This is followed by a positive Pclk edge which moves the write pointer to the middle register M. Again, the read pointer will not address a register until at least one period of Pclk has elapsed since that register's output was changed.

Figure 8:
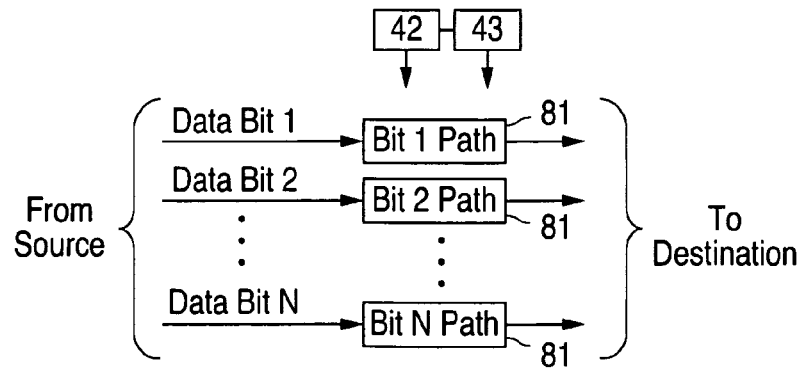
FIG. 8 diagrammatically illustrates how the clock domain linkage apparatus of FIG. 4 can be utilized to support parallel data transfer.

Referring again to FIG. 4, the clock domain linkage apparatus 40 resynchronizes the bits of a bit sequence on a single serial bit transfer path from the sending block (source) to the receiving block (destination). In some embodiments, multiple bits are sent on parallel paths 81, each of which includes the components at 41 and 44-46 in FIG. 4. An example of an N-bit parallel embodiment is illustrated in FIG. 8. Read and write operations in all of the parallel paths of FIG. 8 are controlled by a single pair of state machines 42 and 43.

Figure 9:
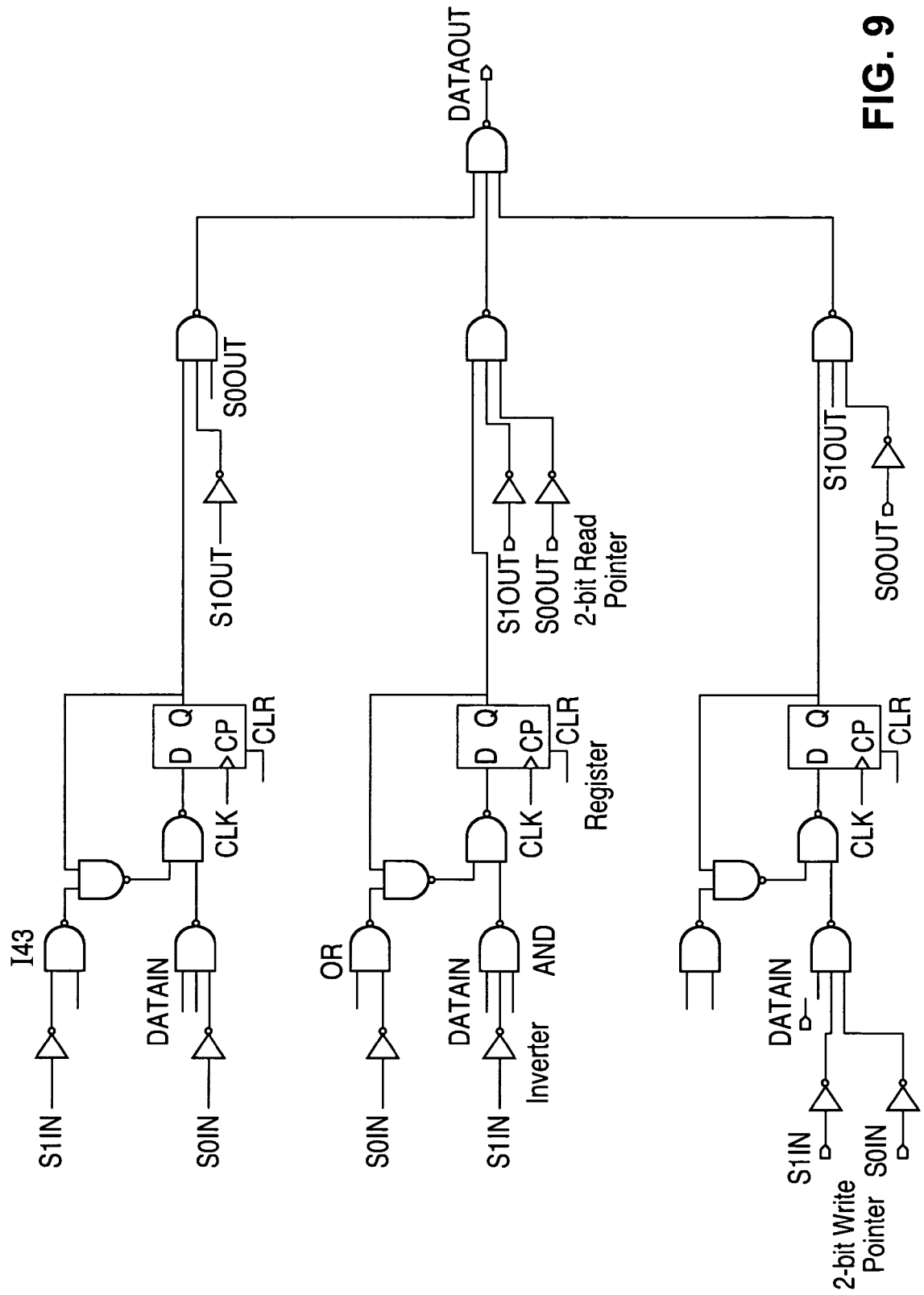
FIG. 9 diagrammatically illustrates a detailed example of the clock domain linkage apparatus of FIGS. 3-5.

FIG. 9 diagrammatically illustrates a detailed example of the embodiments of FIGS. 3-5. The logic circuitry in FIG. 9 produces suitable "write enable" and "read enable" signals in response to the write and read pointers, respectively.

Although the present invention has been described in detail, those skilled in the art should understand that they can make various changes, substitutions and alterations herein without departing from the spirit and scope of the invention in its broadest form.

What is claimed is:

1. An apparatus for providing digital data transfer linkage between first and second clock domains, comprising:
    a data path including a data input, a data output, and a plurality of data storage elements coupled between said data input and said data output;
    a first state machine operable for receiving a first clock signal and operable synchronously with said first clock domain for executing a cyclic sequence of states, each of said states associated with a different one of said data storage elements, wherein said first clock domain is controlled by said first clock signal; and
    a second state machine operable for receiving a second clock signal and operable synchronously with said second clock domain for executing said cyclic sequence of states, wherein said second clock domain is controlled by said second clock signal, and wherein said first clock signal and said second clock signal are mesochronous clock signals;
    said first state machine operable for commencing execution of said cyclic sequence of states in a first state thereof, and said second state machine operable for commencing execution of said cyclic sequence of states in a second state thereof which differs from said first state;
    said data path including an input controller coupled to said data input, said first state machine and said data storage elements, wherein said input controller is operable for coupling first specified ones of said data storage elements to said data input, each first specified data storage element selected based on a current state of said first state machine; and
    said data path including an output controller coupled to said data output, said second state machine and said data storage elements, wherein said output controller is operable for coupling second specified ones of said data storage elements to said data output, each second specified data storage element selected based on a current state of said second state machine;
    wherein the cyclic sequence of states used by both the first and second state machines (i) causes the input controller to couple the first specified data storage elements to the data input in an order of data storage elements defined by the cyclic sequence of states and (ii) causes the output controller to couple the second specified data storage elements to the data output in the order of data storage elements defined by the cyclic sequence of states.

2. The apparatus of claim 1, including three of said data storage elements.

3. The apparatus of claim 1, wherein said data storage elements are data registers.

4. The apparatus of claim 3, wherein said input controller includes a de-multiplexer operable for de-multiplexing data bits from said data input to said plurality of data registers.

5. The apparatus of claim 1, wherein said data storage elements have respective write control inputs operable for receiving said first clock signal.

6. The apparatus of claim 1, wherein said input controller includes a de-multiplexer operable for de-multiplexing data bits from said data input to said plurality of data storage elements.

7. The apparatus of claim 6, wherein said output controller includes a multiplexer operable for multiplexing data from said plurality of data storage elements to said data output.

8. The apparatus of claim 1, wherein said first state machine includes a counter.

9. The apparatus of claim 8, wherein said second state machine includes a second counter.

10. The apparatus of claim 1, wherein said second state machine includes a counter.

11. The apparatus of claim 1, wherein said cyclic sequence of states consists of three states, and wherein said second state is one state ahead of said first state in said cyclic sequence of states.

12. The apparatus of claim 1, including a plurality of said data paths arranged in parallel configuration.

13. An apparatus for providing digital data transfer linkage between first and second clock domains, comprising:
    a data path including a data input, a data output, and a plurality of data storage elements coupled between said data input and said data output;
    a first state machine operable for receiving a first clock signal and operable synchronously with said first clock domain for executing a cyclic sequence of states which are respectively associated with said data storage elements, wherein said first clock domain is controlled by said first clock signal; and
    a second state machine operable for receiving a second clock signal and operable synchronously with said second clock domain for executing said cyclic sequence of states, wherein said second clock domain is controlled by said second clock signal, and wherein said first clock signal and said second clock signal are mesochronous clock signals;

said first state machine operable for commencing execution of said cyclic sequence of states in a first state thereof, and said second state machine operable for commencing execution of said cyclic sequence of states in a second state thereof which differs from said first state;

said data path including an input controller coupled to said data input, said first state machine and said data storage elements, wherein said input controller is operable for coupling a first one of said data storage elements to said data input based on a current state of said first state machine;

said data path including an output controller coupled to said data output, said second state machine and said data storage elements, wherein said output controller is operable for coupling a second one of said data storage elements to said data output based on a current state of said second state machine; and each of said data storage elements having an input and an output, and said apparatus further including a plurality of switches respectively coupled to said data storage elements, each of said switches operable for selectively connecting said input of the associated data storage element to said output of the associated data storage element.

14. The apparatus of claim 13, wherein each of said switches has a control input coupled to said first state machine, each of said switches operable for connecting the input of the associated data storage element to the output of the associated data storage element in response to said first state machine assuming a state other than the state associated with the associated data storage element.

15. An apparatus for providing digital data transfer linkage between first and second clock domains, comprising:
a data path including a data input, a data output, and a plurality of data storage elements coupled between said data input and said data output;
a first state machine operable for receiving a first clock signal and operable synchronously with said first clock domain for executing a cyclic sequence of states, each of said states associated with a different one of said data storage elements, wherein said first clock domain is controlled by said first clock signal; and
a second state machine operable for receiving a second clock signal and operable synchronously with said second clock domain for executing said cyclic sequence of states, wherein said second clock domain is controlled by said second clock signal, and wherein said first clock signal and said second clock signal are mesochronous clock signals;
said first state machine operable for commencing execution of said cyclic sequence of states in a first state thereof, and said second state machine operable for commencing execution of said cyclic sequence of states in a second state thereof which differs from said first state;
said data path including an input controller coupled to said data input, said first state machine and said data storage elements, wherein said input controller is operable for coupling a first specified one of said data storage elements to said data input, the first specified data storage element selected based on a current state of said first state machine; and
said data path including an output controller coupled to said data output, said second state machine and said data storage elements, wherein said output controller is operable for coupling a second specified one of said data storage elements to said data output, the second specified data storage element selected based on a current state of said second state machine;
wherein said first and second state machines have respective enable inputs operable for receiving a common enable signal, said first state machine responsive to said common enable signal for commencing execution of said cyclic sequence of states in said first state, and said second state machine responsive to said common enable signal for commencing execution of said cyclic sequence of states in said second state.

16. The apparatus of claim 15, wherein said common enable signal is synchronized by said first clock signal.

17. A method of providing digital data transfer linkage between first and second clock domains, comprising:
executing a cyclic sequence of machine states synchronously with said first clock domain, each of said states associated with a different one of a plurality of data storage elements, wherein executing said cyclic sequence of machine states synchronously with said first clock domain includes commencing execution of said cyclic sequence of machine states in a first state thereof, wherein said first clock domain is controlled by a first clock signal;
executing said cyclic sequence of machine states synchronously with said second clock domain, wherein executing said cyclic sequence of machine states synchronously with said second clock domain includes commencing execution of said cyclic sequence of machine states in a second state thereof which differs from said first state, wherein said second clock domain is controlled by a second clock signal, and wherein said first clock signal and said second clock signal are mesochronous clock signals;
writing to first specified ones of said data storage elements, each first specified data storage element selected based on a current state within said cyclic sequence of machine states executed synchronously with said first clock domain; and
reading from second specified ones of said data storage elements, each second specified data storage element selected based on a current state within said cyclic sequence of machine states executed synchronously with said second clock domain;
wherein the cyclic sequence of machine states executed synchronously by both the first and second clock domains (i) causes the writing to the first specified data storage elements to occur in an order of data storage elements defined by the cyclic sequence of machine states and (ii) causes the reading from the second specified data storage elements to occur in the order of data storage elements defined by the cyclic sequence of machine states.

18. The method of claim 17, wherein said cyclic sequence of machine states consists of three states, and wherein said second state is one state ahead of said first state in said cyclic sequence of machine states.

19. The method of claim 17, wherein at least one of said executing steps includes counting through a sequence of numerical values.

20. The method of claim 17, including, synchronously with said first clock signal and before said commencing steps, indicating that said executing steps are desired.

* * * * *

UNITED STATES PATENT AND TRADEMARK OFFICE
CERTIFICATE OF CORRECTION

PATENT NO. : 7,668,272 B1  Page 1 of 1
APPLICATION NO. : 10/973761
DATED : February 23, 2010
INVENTOR(S) : Amjad T. Obeidat It is certified that error appears in the above-identified patent and that said Letters Patent is hereby corrected as shown below:

Column 4, line 44, delete "is".

Signed and Sealed this

Thirteenth Day of April, 2010

David J. Kappos
*Director of the United States Patent and Trademark Office*

UNITED STATES PATENT AND TRADEMARK OFFICE
CERTIFICATE OF CORRECTION

PATENT NO. : 7,668,272 B1
APPLICATION NO. : 10/973761
DATED : February 23, 2010
INVENTOR(S) : Amjad T. Obeidat It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1094 days.

Signed and Sealed this

Seventh Day of December, 2010

David J. Kappos
*Director of the United States Patent and Trademark Office*